(12) United States Patent
Lee

(10) Patent No.: US 6,537,837 B2
(45) Date of Patent: Mar. 25, 2003

(54) PATTERN FORMATION METHOD USING TWO ALTERNATING PHASE SHIFT MASKS

(75) Inventor: Sung-woo Lee, Yongin (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/977,323

(22) Filed: Oct. 16, 2001

(65) Prior Publication Data

US 2002/0058348 A1 May 16, 2002

(30) Foreign Application Priority Data

Nov. 10, 2000 (KR) ........................................ 2000-66831

(51) Int. Cl.7 .............................................. G01R 31/26
(52) U.S. Cl. ........................ 438/16; 356/363; 356/359; 356/360; 356/351; 430/312; 430/394; 430/5; 430/396
(58) Field of Search ............................ 438/16; 356/363, 356/359, 360, 351; 430/312, 394, 5, 396

(56) References Cited

U.S. PATENT DOCUMENTS 5,725,971 A * 3/1998 Moriuchi et al.
5,840,448 A * 11/1998 Borodovsky et al.
5,863,677 A * 1/1999 Nakao
5,958,656 A * 9/1999 Nakao
6,134,008 A * 10/2000 Nakao
6,306,558 B1 * 10/2001 Lin

\* cited by examiner

*Primary Examiner*—Long Pham
(74) *Attorney, Agent, or Firm*—Volentine Francos PLLC (57) ABSTRACT

A method of forming patterns wherein a first exposure is performed using a first alternating phase shift mask, and a second exposure is performed using a second alternating phase shift mask. Phase shift regions and non-phase shift regions of the second mask are made to correspond respectively to non-phase shift regions and phase shift regions of the first mask. Consequently, light transmitted through phase shift regions of the first mask during the first exposure, is transmitted through second non-phase shift regions of the second mask during the second exposure, so that weak light intensity is compensated for. Intensities of light passed through phase shift regions and non-phase shift regions are thus the same. Therefore, the ΔCD phenomenon and the inversion phenomenon of critical dimensions between phase shift regions and non-phase shift regions with respect to different focuses, may be prevented.

19 Claims, 8 Drawing Sheets

PATTERN FORMATION METHOD USING TWO ALTERNATING PHASE SHIFT MASKS

The present application claims priority under 35 U.S.C. §119 to Korean Application No. 2000-66831, which is hereby incorporated by reference in its entirety for all purposes.

BACKGROUND OF THE INVENTION

1. Field of the Invention

The present invention relates to a method of forming patterns, and more particularly, to a method of forming patterns using two alternating phase shift masks.

2. Description of the Related Art

It is well known that patterns used in manufacturing a semiconductor device are usually formed by photolithography. In photolithography, a photoresist whose solubility varies is formed on a layer where a pattern will be formed, such as an insulating layer or a conductive layer on a semiconductor substrate. The solubility of the photoresist is varied by irradiating light such as x-rays and ultraviolet rays thereon. For example, a prescribed region of the photoresist is exposed to light using a mask, and subsequently a part of the photoresist which has a high solubility with respect to a developing solution is removed, thereby forming a photoresist pattern. After the photoresist pattern is formed, the exposed portion of the underlayer where the pattern will be formed is removed by an etching process, thereby forming various patterns such as an interconnection and an electrode.

As semiconductor devices become more highly integrated, a lithography technology which can form much finer patterns is needed. In response to this requirement, an exposure method using an electron beam, an ion beam or x-rays; a modified illumination method using the diffraction of a light source; an exposure method using new photoresist materials; and an exposure method using a phase shift mask have been suggested.

Among these methods, the exposure method using a phase shift mask, can increase resolution or depth of focus by installing a shifter in the phase shift mask and using whole or partial interference of rays. In other words, when light passes through a mask substrate of the phase shift mask or a shifter layer, its wavelength shortens to the quotient of the wavelength in a vacuum divided by a refractive index. Thus, the phase of light can be varied depending on whether there is a shifter or not.

Here, if θ indicates the path difference of light, θ=2πt(n−1)/λ (wherein n is the refractive index of the shifter, t is the thickness of the shifter, and λ is the wavelength used). If θ is equal to π, light which has passed through the shifter has an inverse phase. Therefore, if the shifter is placed at the edge of a mask pattern, the contrast of light may be increased because light passing through a transparent region has an inverse phase with respect to that of light passing through the shifter, and consequently the intensity of light becomes zero at the boundary of the pattern. Unlike other exposure methods, the exposure method using the phase shift mask can greatly improve the resolution of the mask by changing only a mask manufacturing method, without changing equipment or photoresist materials.

Various types of phase shift masks are manufactured. For example, an alternating phase shift mask includes two different types: a glass substrate etching type which can shift a phase 180° by etching a glass substrate, and a SOG type which can shift phase 180° by covering a common mask substrate with SOG and subsequently patterning. Hereinafter, a method of forming a pattern using a conventional alternating phase shift mask of the glass substrate etching type, will be described.

Figure 1A:
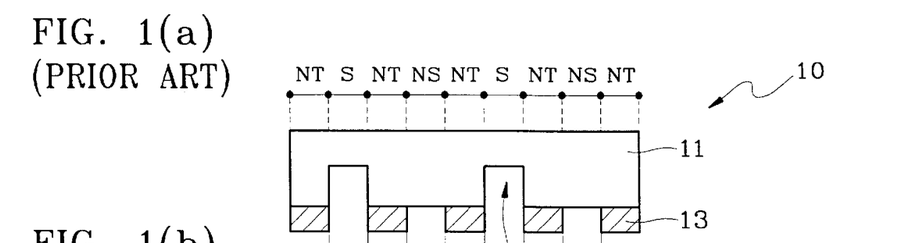
FIG. 1(a) is a sectional view of an example of a conventional alternating phase shift mask and FIG. 1(b) is a graph illustrating the distribution of light intensity on a wafer during exposure using the alternating phase shift mask of FIG. 1(a).
Figure 1B:
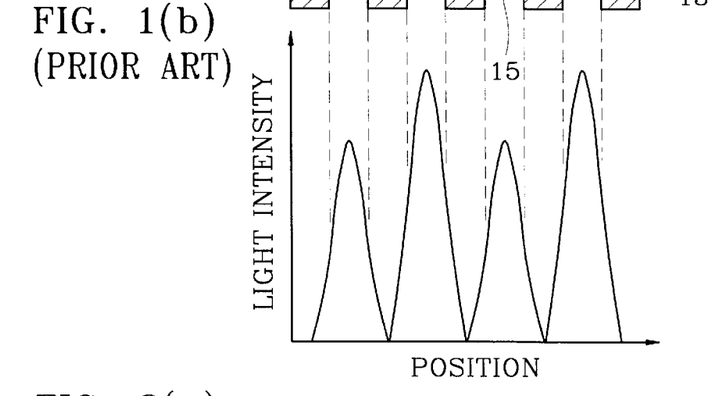

FIG. 1(a) is a sectional view of an example of a conventional alternating phase shift mask, and FIG. 1(b) is a graph illustrating the distribution of light intensity on a wafer during exposure using the alternating phase shift mask of FIG. 1(a). In FIG. 1(a), a plurality of opaque patterns 13 which shield light are formed on the surface of a glass substrate 11 of an alternating phase shift mask 10. Each opaque pattern 13 is made of a chrome layer. Between two opaque patterns 13, there is a groove 15 formed by etching the glass substrate 11. Each groove 15 acts as a phase shifter. The phase of light passing through the grooves 15 is inverted by 180° with respect to the phase of light passing through the other portions, thereby enhancing the resolution. Therefore, the alternating phase shift mask 10 of FIG. 1(a) includes non-transparent regions (NT), phase shift regions (S), and non-phase shifted regions (NS).

During exposure using the alternating phase shift mask illustrated in FIG. 1(a), exposure light passing through the phase shift region loses its energy because the light is scattered between both side walls of each groove 15. Therefore, as illustrated in FIG. 1(b), the intensity of exposure light passing through the phase shift regions (S) becomes smaller than the intensity of light passing through the non-phase shifted regions (NS). Consequently, there is a difference in the critical dimension (CD) of photoresist patterns formed on a wafer, and this is referred as a ΔCD phenomenon.

Figures 2A, 2B:
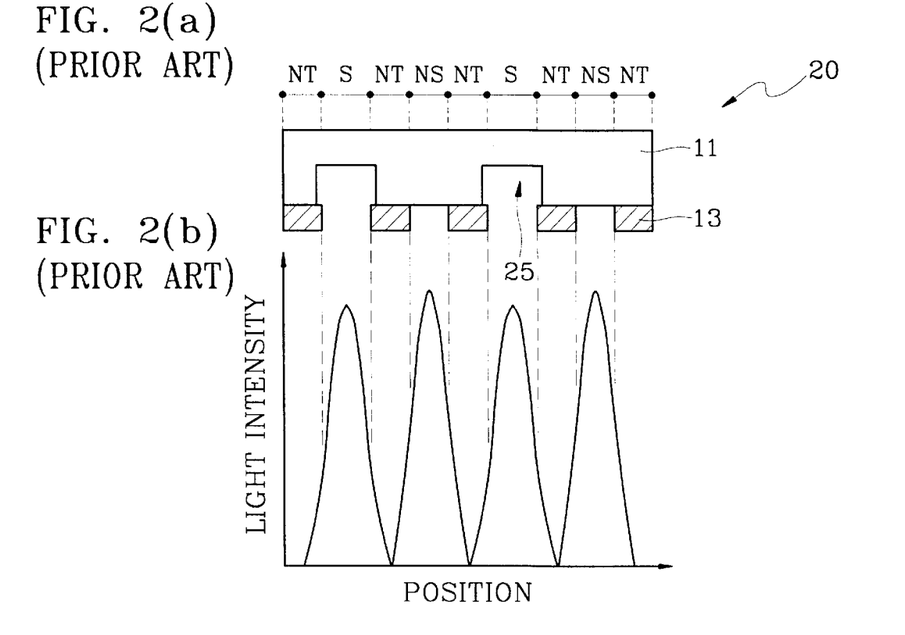
FIG. 2(a) is a sectional view of another example of a conventional alternating phase shift mask and FIG. 2(b) is a graph illustrating the distribution of light intensity on a wafer during exposure using the alternating phase shift mask of FIG. 2(a)

FIG. 2(a) is a sectional view of another example of a conventional alternating phase shift mask, and FIG. 2(b) is a graph illustrating the distribution of light intensity on a wafer during exposure using the alternating phase shift mask of FIG. 2(a). The same reference numerals in FIGS. 1(a) and 1(b) represent the same elements. Except for the formation of undercut grooves 25 as a shifter, the alternating phase shift mask 20 of FIG. 2(a) is the same as that of FIG. 1(a). The grooves 25 are formed by etching portions of the glass substrate 11 under the opaque patterns 13. The undercut grooves 25 can significantly reduce the difference of light intensity between a phase shift region (S) and a non-phase shifted region (NS) during exposure, thereby essentially preventing the ΔCD phenomenon. However, there are problems when using the alternating phase shift mask of FIG. 2(a), as described with reference to FIGS. 3 and 4.

Figure 3:
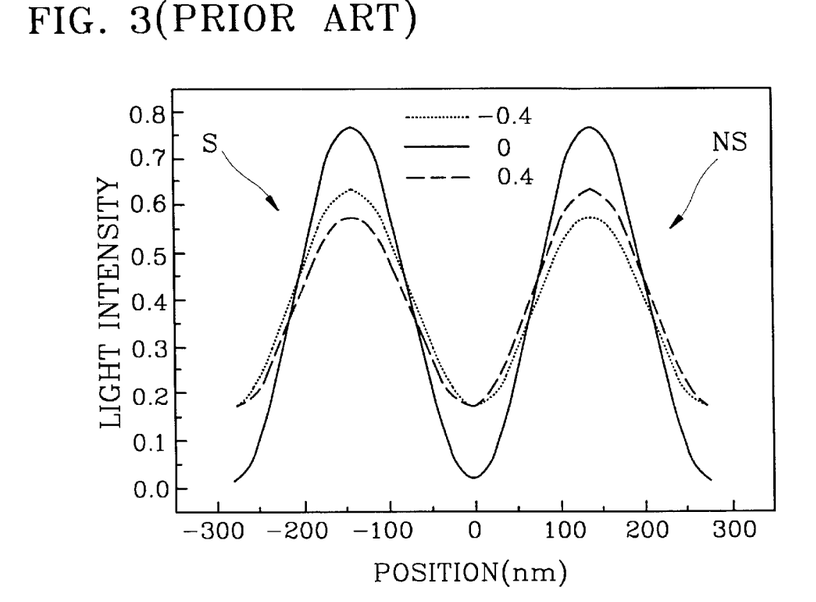
FIGS. 3 and 4 are graphs illustrating the distribution of light intensity with respect to the position on a wafer and the distribution of critical dimension on a wafer with respect to different exposure focuses, respectively, using the alternating phase shift mask of FIG. 2(a)
Figure 4:
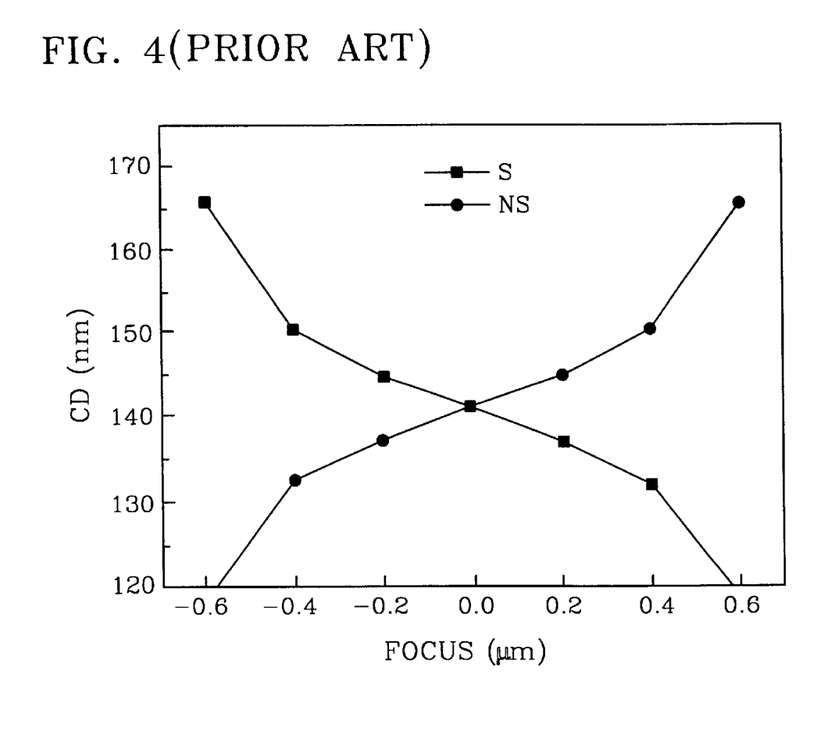

FIGS. 3 and 4 are graphs illustrating the distribution of light intensity with respect to position on a wafer and the critical dimension on a wafer with respect to different exposure focuses, respectively, using the alternating phase shift mask illustrated in FIG. 2(a). During exposure using the alternating phase shift mask 20 in which the undercut grooves 25 of FIG. 2(a) are used as shifters, when the focus is 0 μm as illustrated in FIGS. 3 and 4, there is no difference in the light intensity and in the critical dimension respectively between a phase shift region (S) and a non-phase shifted region (NS). On the other hand, when the focus is not 0 μm, the critical dimensions of a phase shift region (S) and a non-phase shifted region (NS) are very different from each other due to the difference of light intensity between them.

Moreover, when the focus changes from −0.4 μm to 0.4 μm, the line indicating the critical dimension of the non-phase shifted region (NS) has a positive gradient, but the line indicating the critical dimension of the phase shift region (S) has a negative gradient. These two lines cross each other at a particular focus. Therefore, as the focus changes from −0.4 μm to 0.4 μm, the critical dimension of the phase shift region (S) inverses that of the non-phase shifted region (NS), on the basis of the focus of 0 μm. This is referred as an "inversion phenomenon of critical dimensions".

However, since the alternating phase shift mask at which the inversion phenomenon of critical dimensions occurs has small mask or phase margin, it cannot be used at all or its usefulness is quite low. Moreover, the alternating phase shift mask of FIG. 2(a) has another problem in which the opaque patterns 13 are damaged during the formation of the undercut grooves 25.

SUMMARY OF THE INVENTION

The present invention is therefore directed to a pattern formation method using two alternating phase shift masks, which substantially overcomes one or more of the problems due to the limitations and disadvantages of the related art.

To solve the above and other problems, it is an object of the present invention to provide a method of forming patterns by preventing an inversion phenomenon of critical dimensions, increasing the resolution of an alternating phase shift mask, and enlarging focus margins.

To achieve the above and other objects of the invention, the present invention provides a method of forming patterns in which, after a first exposure has been performed using a first alternating phase shift mask, a second exposure is subsequently performed using a second alternating phase shift mask.

The first alternating phase shift mask includes a first non-phase shift region where exposure light is transmitted and the light phase is not changed, a first phase shift region where light is transmitted and the light phase is changed, and a non-transparent region through which light cannot penetrate, located between the first non-phase shift region and the first phase shift region, on a first mask substrate, that is a glass substrate.

The second alternating phase shift mask includes a second non-phase shift region where light is transmitted and the light phase is not changed, a second phase shift region where light is transmitted and the light phase is changed, and a non-transparent region through which light cannot be transmitted, located between the second non-phase shift region and the second phase shift region, on a second mask substrate.

During the second exposure, the second phase shift region and the second non-phase shift region of the second alternating phase shift mask are made to correspond to the first non-phase shift region and the first phase shift region of the first mask, respectively. Consequently, a portion where the intensity of exposure light was weak during the first exposure because of having passed through the first alternating phase shift region (S), corresponds to the second non-phase shift region (NS) during the second exposure, so that the light intensity can be compensated. As a result, the intensities of the light passing through the phase shift regions (S) and the non-phase shift regions (NS) of the first and second alternating phase shift masks have the same values. Therefore, both the ΔCD phenomenon and the inversion phenomenon of the critical dimension values between the phase shift region (S) and the non-phase shift region (NS) with respect to different focuses may be prevented.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinafter, preferred embodiments of the present invention will be described in detail with reference to the attached drawings. This invention may be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity.

Figure 5:
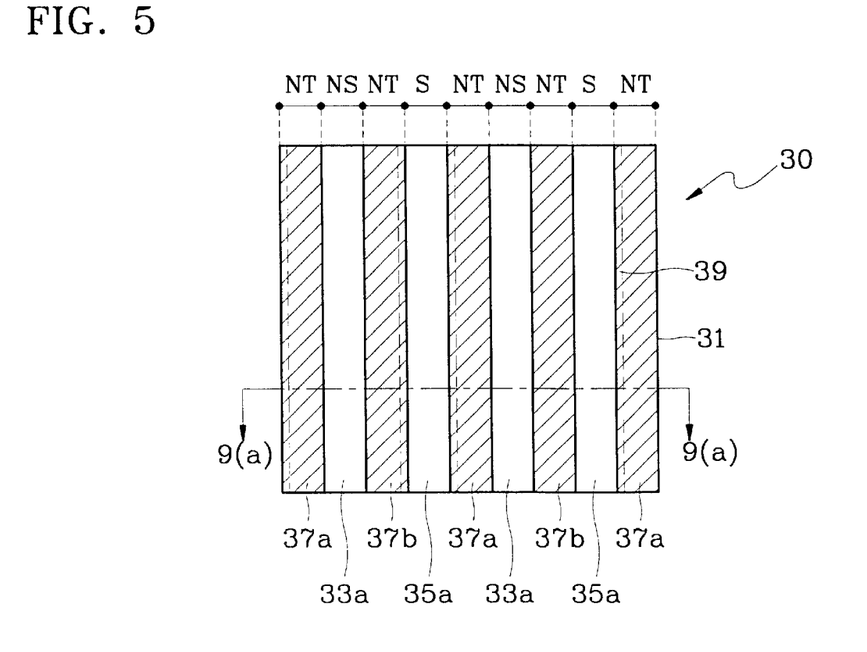
FIGS. 5 and 6 are sectional views illustrating examples of a first alternating phase shift mask and a second alternating phase shift mask, respectively, which are used in a method of forming patterns according to an embodiment of the present invention.
Figure 6:
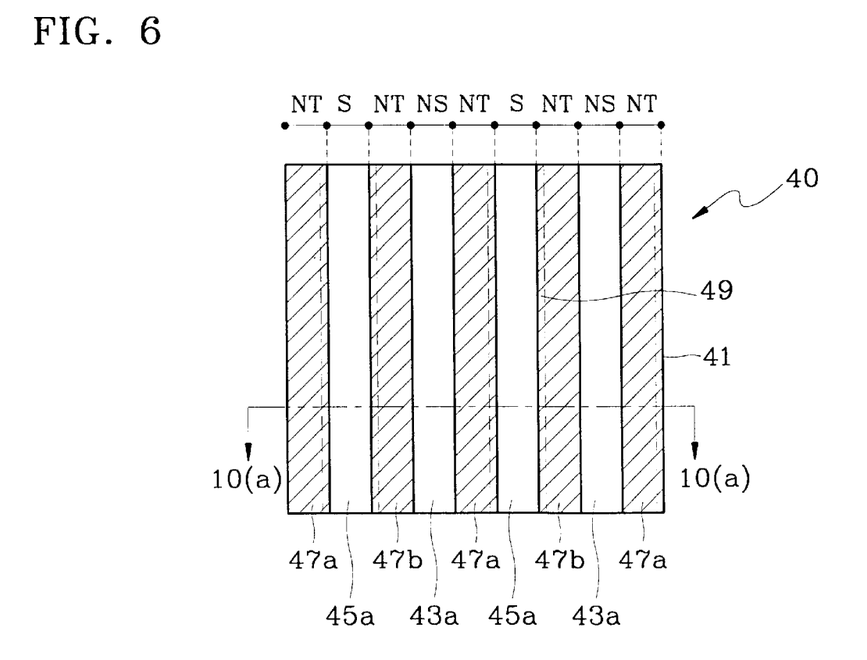

FIGS. 5 and 6 are sectional views illustrating examples of a first alternating phase shift mask and a second alternating phase shift mask, respectively, which are used in a method of forming patterns according to the present invention. A method of forming patterns according to the present invention uses a dual exposure process including a first exposure process using a first alternating phase shift mask 30 and a second exposure process using a second alternating phase shift mask 40, where the amount of light used in each exposure is half the amount of light used in a single exposure process.

As illustrated in FIG. 5, the first alternating phase shift mask 30 includes first non-phase shift regions (NS) 33a where light is transmitted and the light phase is not changed, first phase shift regions (S) 35a where light is transmitted and the light phase is changed, and non-transparent regions (NT) 37a and 37b where light cannot be transmitted, respectively located between a first non-phase shift region (NS) 33a and a first phase shift region (S) 35a, on a first mask substrate 31, that is a glass substrate. In the first alternating phase shift mask 30, the first phase shift regions 35a can be comprised of grooves formed by etching the mask substrate 31. To prevent the scattering of exposure light, anti-scattering regions 39 are formed between the non-transparent regions 37a and 37b and the first phase shift regions 35a. The anti-scattering regions 39 can be comprised of undercut grooves formed by laterally etching the sides of the grooves of the first phase shift regions 35a to a prescribed depth.

As illustrated in FIG. 6, the second alternating phase shift mask 40 includes second non-phase shift regions (NS) 43a where light is transmitted and the light phase is not changed, second phase shift regions (S) 45a where light is transmitted and the light phase is changed, and non-transparent regions (NT) 47a and 47b where light can not be transmitted, respectively located between the second non-phase shift regions (NS) 43a and the second phase shift regions (S) 45a on a second mask substrate 41, that is a glass substrate. In the second alternating phase shift mask 40, the second phase shift regions 45a can be comprised of grooves formed by etching the mask substrate 41. To prevent the scattering of light used during exposure, anti-scattering regions 49 are formed between the non-transparent regions 47a and 47b and the first phase shift regions 45a. The anti-scattering regions 49 can be comprised of undercut grooves formed by laterally etching the sides of the groove of the first phase shift regions 45a to a prescribed depth.

Comparing the second alternating phase shift mask 40 with the first alternating phase shift mask 30, the two masks include the same structure and components, that is, the non-phase shift regions (NS), the phase shift regions (S), and the non-transparent regions (NT) that are located between a non-phase shift region (NS) and phase shift region (S). However, when exposed to light, the light phases made by the two masks are quite different from each other. In other words, when performing the second exposure process, the second phase shift regions 45a and the second non-phase shift regions 43a in the second alternating phase shift mask 40, are made to correspond to the first non-phase shift regions 33a and the first phase shift regions 35a in the first alternating phase shift mask 30, respectively.

In particular, in the first alternating phase shift mask 30 of FIG. 5, a first non-transparent region 37a, a first non-phase shift region 33a, a second non-transparent region 37b, and a first phase shift region 35a are sequentially and repeatedly arranged, in a particular direction, that is in a horizontal direction. On the other hand, in the second alternating phase shift mask 40 of FIG. 6, a first non-transparent region 47a, a first phase shift region 45a, a second non-transparent region 47b, and a first non-phase shift region 43a are sequentially and repeatedly arranged. Thus the phase shift regions and the non-phase shift regions of the second alternating phase shift mask 40 are moved by one pitch with respect to the phase shift regions and the non-phase regions of the first alternating phase mask 30. Therefore, dual exposure using the first alternating phase shift mask 30 and the second alternating phase shift mask 40 as illustrated in FIGS. 5 and 6 respectively, makes it possible to form a photoresist layer pattern of a line/space type.

Figure 7:
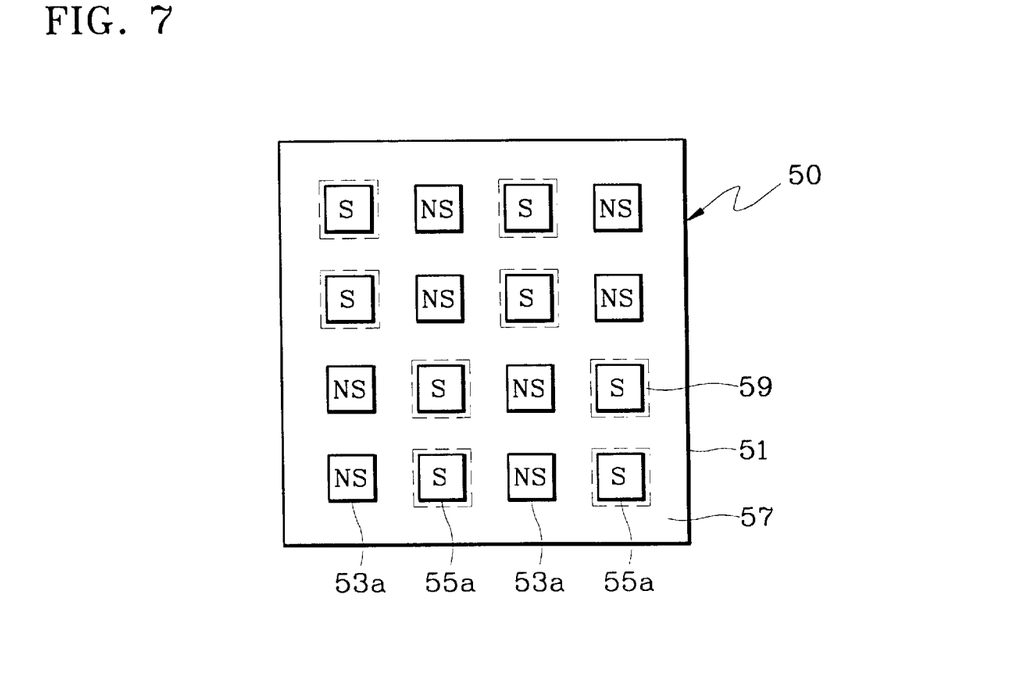
FIGS. 7 and 8 are sectional views illustrating examples of a first alternating phase shift mask and a second alternating phase shift mask, respectively, which are used in a method of forming patterns according to another embodiment of the present invention.
Figure 8:
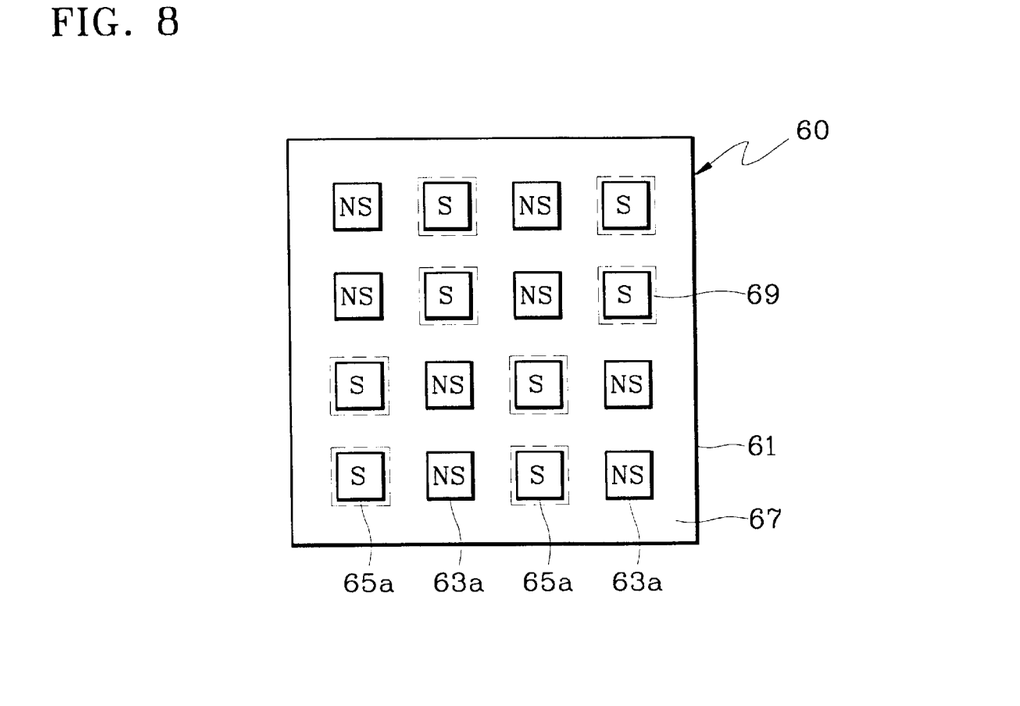

FIGS. 7 and 8 are plan views illustrating further examples of a first alternating phase shift mask and a second alternating phase shift mask, respectively, which are used in the pattern formation according to the present invention. It is to be noted that a method of forming patterns according to this embodiment of the present invention uses a dual exposure process including a first exposure process using a first alternating phase shift mask 50 and a second exposure process using a second alternating phase shift mask 60, where the amount of light used in each exposure is half the amount of light used in a single exposure.

As illustrated in FIG. 7, the first alternating phase shift mask 50 includes first non-phase shift regions (NS) 53a through which light is transmitted and the light phase is not changed, first phase shift regions (S) 55a through which light is transmitted and the light phase is changed, and a non-transparent region 57 through which light cannot be transmitted, located between the first non-phase shift regions 53a and the first phase shift regions 55a, on a first mask substrate 51, that is a glass substrate. In the first alternating phase shift mask 50, the first phase shift regions 55a can be comprised of grooves formed by etching the mask substrate 51. To prevent the scattering of exposure light, anti-scattering regions 59 are formed around the first phase shift regions 55a. The anti-scattering regions 59 can be comprised of undercut grooves formed by laterally etching the sides of the grooves forming the first phase shift regions 55a to a prescribed depth.

As illustrated in FIG. 8, the second alternating phase shift mask 60 includes second non-phase shift regions (NS) 63a through which light is transmitted and the light phase is not changed, second phase shift regions (S) 65a through which light is transmitted and the light phase is changed, and non-transparent region 67 through which light cannot be transmitted, located between the second non-phase shift regions 63a and the second phase shift regions 65a, on a second mask substrate. In the second alternating phase shift mask 60, the second phase shift regions 65a can be comprised of grooves formed by etching the mask substrate 61. To prevent the scattering of light during exposure, anti-scattering regions 69 are formed around the first phase shift regions 65a. The anti-scattering regions 69 are made by forming undercut grooves by laterally etching the sides of the grooves forming the first phase shift regions 65a to a prescribed depth.

Comparing the second alternating phase shift mask 60 with the first alternating phase shift mask 50, the two masks include the same structure and components, that is, the non-phase shift regions (NS), the phase shift regions (S), and the non-transparent regions (NT) located between the non-phase shift regions and the phase shift regions. However, the light phases made by the two masks are quite different from each other with respect to exposure. In other words, when performing the second exposure process, the second phase shift regions 65a and the second non-phase shift regions 63a in the second alternating phase shift mask 60 are made to correspond respectively to the non-phase shift regions 53a and the phase shift regions 55a in the first alternating phase shift mask 50.

In particular, in the first alternating phase shift mask 50 of FIG. 7 and the second alternating phase shift mask 60 of FIG. 8, the phase shift regions and the non-phase shift regions are sequentially and repeatedly arranged at regular intervals between the non-transparent regions. In the case of a dual exposure using the two masks illustrated in FIGS. 7 and 8, a photoresist layer pattern having a contact hole formed therein can be obtained. As shown in FIGS. 7 and 8, the phase shift regions (S) and the non-phase shift regions (NS) are arranged in an alternating fashion. However, the phase shift regions (S) and the non-phase shift regions (NS) in the first and second alternating phase shift masks 50 and 60 may be arranged in any fashion, as long as the phases of each of the regions in one mask are shifted with respect to the phases of each of the corresponding regions in the other mask.

Figure 9A:
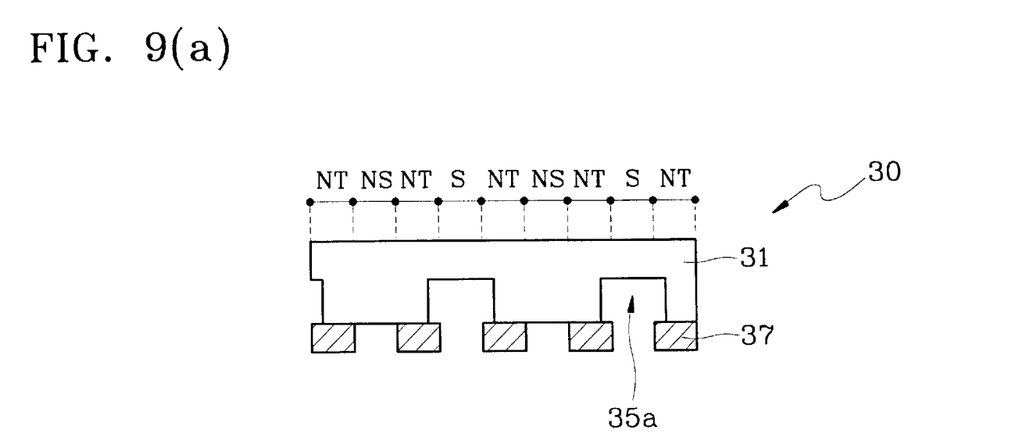
FIG. 9(a) is a sectional view of the first phase shift mask, taken along the line 9(a)—9(a) of FIG. 5.
Figure 9B:
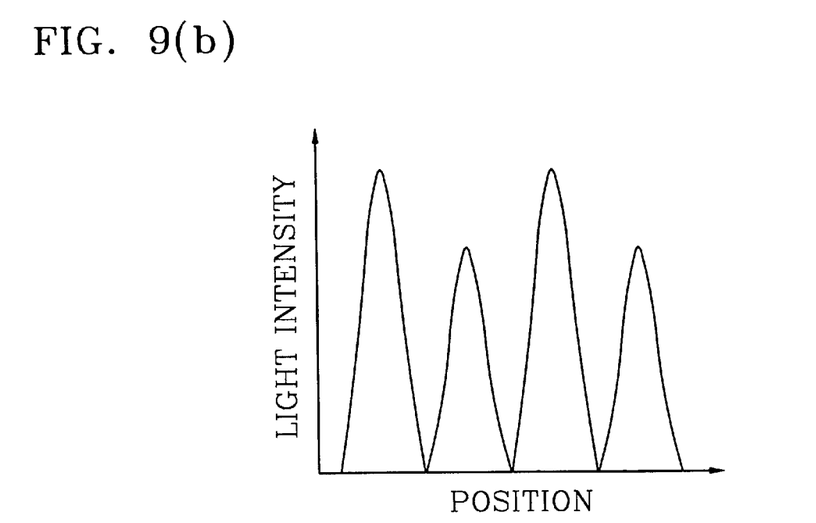
FIG. 9(b) is a graph illustrating the distribution of light intensity on a wafer in a case of a first exposure using the first alternating phase shift mask.

Hereinafter, a method of forming a pattern according to the present invention, will be described in detail with reference to the alternating phase shift masks in FIGS. 5 and 6. FIG. 9(a) is a sectional view of the first phase shift mask taken along the line 9(a)—9(a) of FIG. 5, and FIG. 9(b) is a graph illustrating the distribution of light intensity on a wafer in the case of a first exposure using the first alternating phase shift mask.

In particular, the first alternating phase shift mask 30 of FIG. 5 has a plurality of opaque patterns 37 which are formed at regular intervals on the first mask substrate 31, that is the glass substrate, as illustrated in FIG. 9(a). The opaque patterns 37 are formed into chrome patterns and consequently form the non-transparent regions. The undercut grooves 35a are formed between the opaque patterns 37 by etching the first mask substrate 31. The above undercut grooves 35a, which act as phase shifters, form the phase shift regions. The phase of exposure light transmitted through the undercut grooves 35a is shifted 180° with respect to the phase of exposure light transmitted through the other portions of the mask, thereby enhancing the resolution. Therefore, the first alternating phase shift mask 30 can be divided into three components including the non-transparent regions (NT), the phase shift regions (S), and the non-phase shift regions (NS).

During the first exposure, exposure light loses its energy because it is scattered between both side walls of the undercut grooves 35a formed by etching the first mask substrate 31. Consequently, as illustrated in FIG. 9(b), the intensity of light passing through the phase shift regions becomes smaller than the intensity of light passing through non-phase shift regions.

Figure 10A:
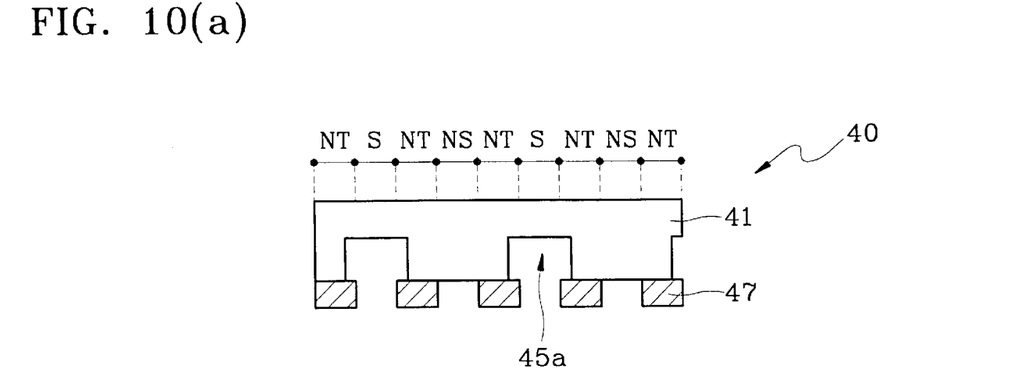
FIG. 10(a) is a sectional view of the second phase shift mask, taken along the line 10(a)—10(a) of FIG. 6.
Figure 10B:
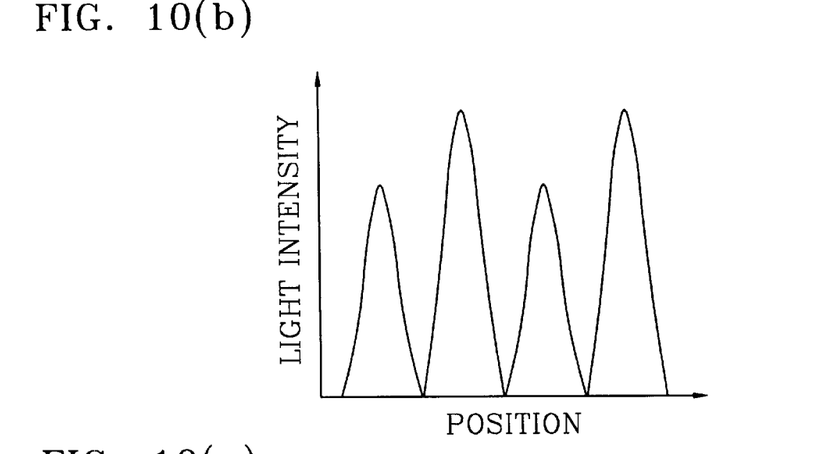
FIG. 10(b) is a graph illustrating the distribution of light intensity on a wafer in a case of second exposure using the second alternating phase shift mask.
Figure 10C:
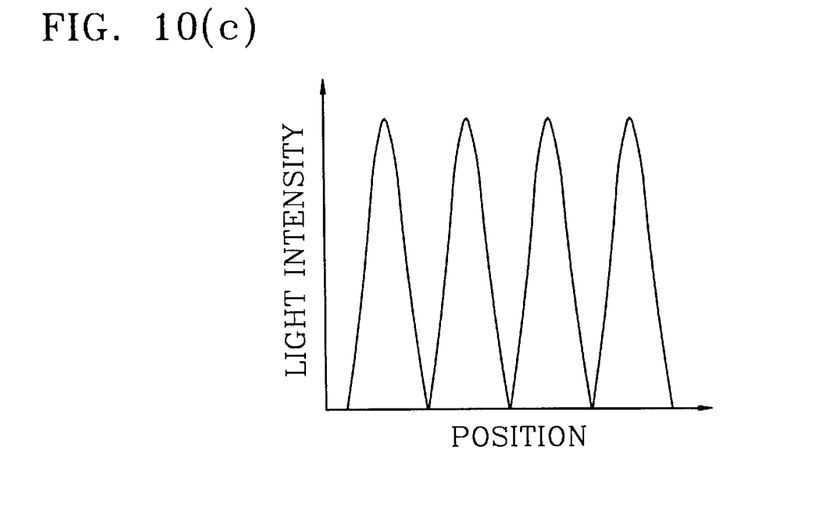
FIG. 10(c) is a graph illustrating the distribution of light intensity on a wafer in a case of dual exposure using the first alternating phase shift mask of FIG. 5 and the second alternating phase shift mask of FIG. 6.

FIG. 10(a) is a sectional view of the second phase shift mask, taken along the line 10(a)—10(a) of FIG. 6, and FIG. 10(b) is a graph illustrating the light intensity on a wafer in the case of a second exposure process using the second alternating phase shift mask. FIG. 10(c) is a graph illustrating the light intensity on a wafer in the case of a dual exposure process using the first alternating phase shift mask of FIG. 5 and the second alternating phase shift mask of FIG. 6. The same reference numerals in FIGS. 9(a) and 10(a) represent the same elements.

The second alternating phase shift mask 40 has a plurality of opaque patterns 47 which are formed at regular intervals on the second mask substrate 41, that is the glass substrate, as illustrated in FIG. 10(a). The opaque patterns 47 are formed into chrome patterns and consequently form the non-transparent regions. The undercut grooves 45a are formed between the opaque patterns 47 by etching the first mask substrate 41. The undercut grooves 45a, which act as phase shifters, form the phase shift regions.

The second alternating phase shift mask 40 is formed to have a phase different from that of the first alternating phase shift mask 30, as may be understood in view of FIGS. 9(b) and 10(b). In other words, in the case of the second exposure, the second phase shift regions and the second non-phase shift regions of the second alternating phase shift mask are made to correspond to the first non-phase shift regions and the first phase shift regions of the first mask, respectively. Consequently, a portion where the light intensity is weak due to being transmitted through the first alternating phase shift regions (S) during the first exposure, is transmitted through the second non-phase shift regions (NS) during the second exposure, thereby compensating for the light intensity. As a result, the intensities of light passing through the phase shift regions (S) and non-phase shift regions (NS) become the same, as may be understood in view of FIG. 10(c).

Figure 11:
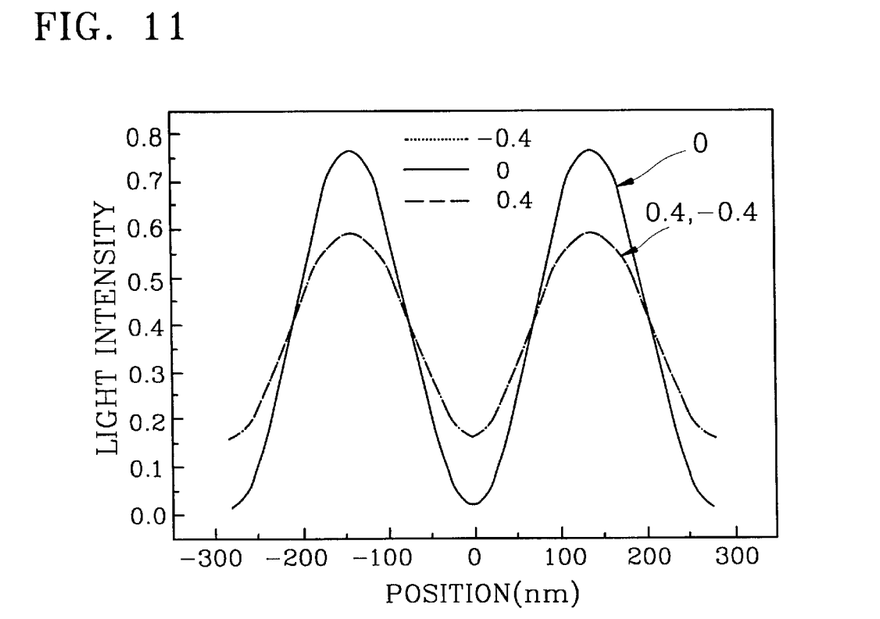
FIGS. 11 and 12 are graphs illustrating the distribution of light intensity with respect to the position on a wafer and the distribution of critical dimension on a wafer with respect to different focuses, in a case of dual exposure using the first alternating phase shift mask of FIG. 5 and the second alternating phase shift mask of FIG. 6, respectively.
Figure 12:
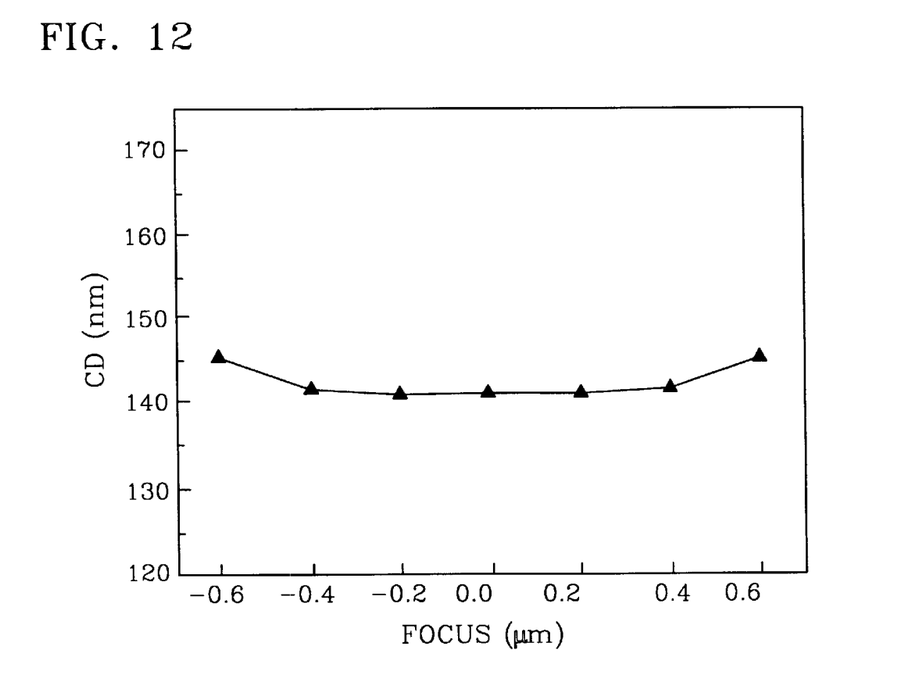

FIGS. 11 and 12 are graphs illustrating the distribution of light intensity with respect to the position on a wafer and the distribution of critical dimension on a wafer with respect to different focuses in a case of dual exposure using the first alternating phase shift mask 30 of FIG. 5 and the second alternating phase shift mask 40 of FIG. 6, respectively. As illustrated in FIG. 11, in the case of dual exposure using the first and second alternating phase shift masks, the phase shift regions and the non-phase shift regions respectively have the same light intensity with respect to each other, when the focus is 0 μm, 0.4 μm, and −0.4 μm. Therefore, as illustrated in FIG. 12, even if the focus changes from −0.4 μm to 0.4 μm, the critical dimensions of patterns have almost uniform values. In other words, according to a method of forming patterns of the present invention, the ΔCD phenomenon and the inversion phenomenon of critical dimensions in which the critical dimension of the phase shift regions (S) inverses that of the non-phase shift regions (NS), can be prevented.

Figure 13:
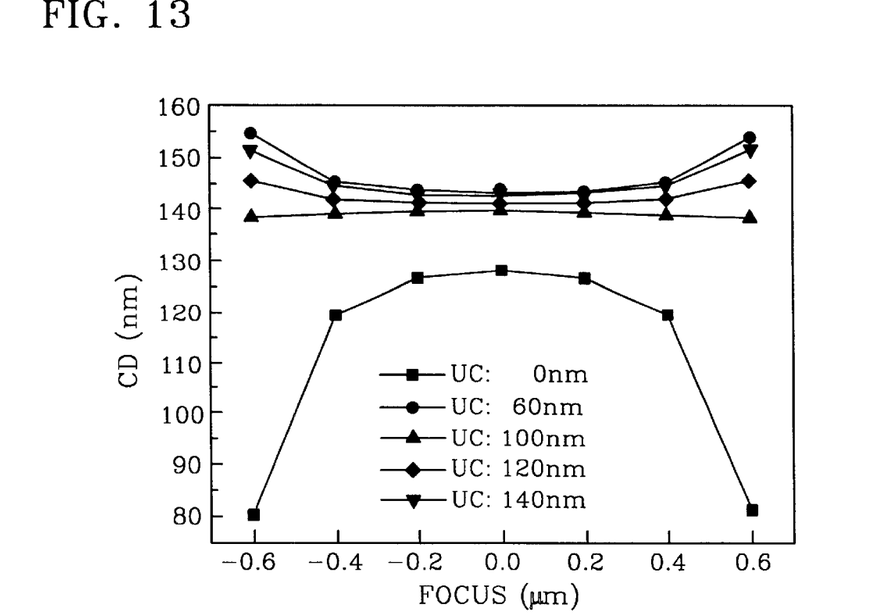
FIG. 13 is a graph illustrating the distributions of critical dimensions for various undercut conditions, in a case of dual exposure using the first alternating phase shift mask of FIG. 5 and the second alternating phase shift mask of FIG. 6.

FIG. 13 is a graph illustrating the critical dimension distribution according to changes in undercut conditions, in the case of dual exposure using the first alternating phase shift mask of FIG. 5 and the second alternating phase shift mask of FIG. 6. In particular, FIG. 13 shows the distribution of the critical dimensions of photoresist patterns with respect to different focuses in the case that the phase difference between the phase shift regions and the non-phase shift regions is 180° and the undercut is 0 nm, 60 nm, 100 nm, 120 nm, or 140 nm when dual exposure is performed using the first and second alternating phase shift masks. As illustrated in FIG. 13, in the case of the undercut of 0 nm, the margin of focus is 0.8 μm, while in the case of the undercut of 60–140 μm, the focus margin is 1.2 μm. Therefore, if the undercutting process is performed, better focus margin can be obtained.

Figure 14:
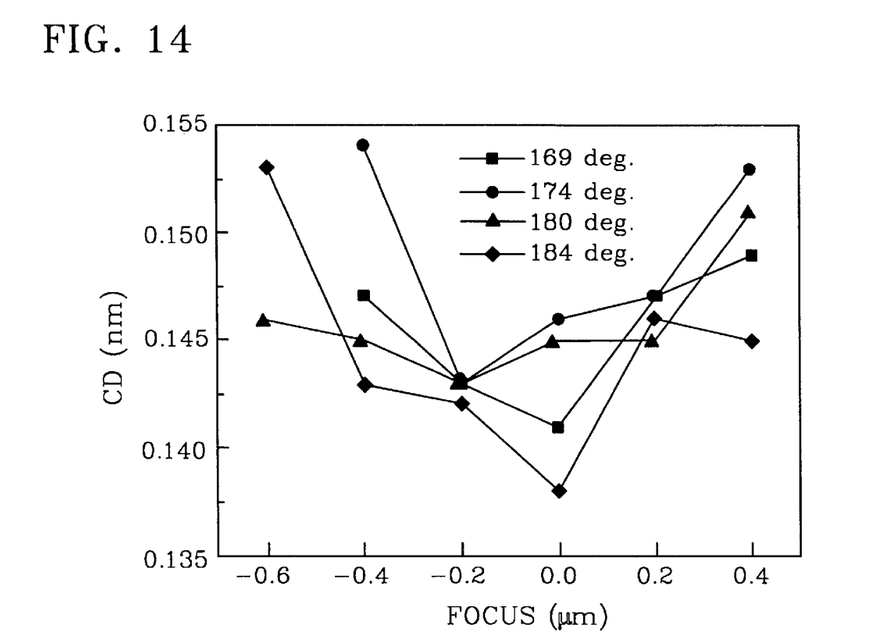
FIG. 14 is a graph illustrating the distributions of critical dimensions for various phase differences in the case of a dual exposure process using the first alternating phase shift mask of FIG. 5 and the second alternating phase shift mask of FIG. 6.

FIG. 14 is a graph illustrating the distribution of critical dimensions for different phase differences in the case of a dual exposure process using the first alternating phase shift mask of FIG. 5 and the second alternating phase shift mask of FIG. 6. In particular, FIG. 14 shows the distribution of critical dimensions of photoresist patterns according to different focuses in the case that the phase difference between the phase shift region and the non-phase shift region is 169°, 174°, 180°, 184° and the undercut is 130 nm when dual exposure is performed using the first and second alternating phase shift masks. In the case of the phase difference of 180° or 184°, the focus is 1 $\mu$m. On the other hand, in case of the phase difference of 169° or 174°, the focus is 0.8 $\mu$m.

As described in the above, the present invention provides a method of forming patterns in which, after a first exposure has been performed on a photoresist layer covering a wafer using a first alternating phase shift mask, a second exposure is performed using a second alternating phase shift mask. In the second exposure, phase shift regions (S) and non-phase shift regions (NS) of the second alternating phase shift mask are made to correspond to the non-phase shift regions (NS) and the phase shift regions (S) of the first mask 30, respectively.

Consequently, a portion of light with weak intensity because of being transmitted through the first alternating phase shift regions (S) during the first exposure, is transmitted through the second non-phase shift regions (NS) during the second exposure, so that the weak intensity is compensated for. As a result, the intensities of the light which passes through the phase shift regions (S) and the light which passes through the non-phase shift regions (NS) are the same. Therefore, both the $\Delta$CD phenomenon and the inversion phenomenon of critical dimensions between the phase shift regions (S) and the non-phase shift regions (NS) with respect to different focuses may be prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a pattern on a photoresist layer covering a wafer, comprising:

performing a first exposure on the photoresist layer using a first alternating phase shift mask, the first alternating phase shift mask including a first non-phase shift region through which light is transmittable and light phase is not changed, a first phase shift region through which light is transmittable and light phase is changed, and first a non-transparent region through which light cannot be transmitted, the first non-transparent region being located between the first non-phase shift region and the first phase shift region on a first mask substrate;

performing a second exposure on the photoresist layer using a second alternating phase shift mask, the second alternating phase shift mask including a second non-phase shift region through which light is transmittable and light phase is not changed, a second phase shift region through which light is transmittable and light phase is changed, and a second non-transparent region through which light cannot be transmitted, the second non-transparent region being located between the second non-phase shift region and the second phase shift region, on a second mask substrate, wherein during the second exposure, the second phase shift region and the second non-phase shift region of the second alternating phase shift mask respectively correspond to the first non-phase shift region and the first phase shift region of the first alternating phase shift mask.

2. The method of claim 1, wherein the first phase shift region and the second phase shift region are grooves formed by respectively etching the first mask substrate and the second mask substrate.

3. The method of claim 2, wherein an anti-scattering region is formed between the first non-transparent region and the first phase shift region of the first alternating phase shift mask, and an anti-scattering region is formed between the second non-transparent region and the second phase shift region of the second alternating phase shift mask.

4. The method of claim 3, wherein the anti-scattering regions are formed by laterally etching sides of the grooves to a prescribed depth.

5. The method of claim 1, wherein an anti-scattering region is formed between the first non-transparent region and the first phase shift region of the first alternating phase shift mask, and an anti-scattering region is formed between the second non-transparent region and the second phase shift region of the second alternating phase shift mask.

6. The method of claim 1, wherein said performing a second exposure is subsequent said performing a first exposure.

7. The method of claim 1, wherein the first alternating phase shift mask includes a plurality of first non-phase shift regions, a plurality of first phase shift regions and a plurality of first non-transparent regions, the plurality of first non-transparent regions being respectively located between respective pairs of a first non-phase shift region and a first phase shift region.

8. The method of claim 7, wherein the second alternating phase shift mask includes a plurality of second non-phase shift regions, a plurality of second phase shift regions and a plurality of second non-transparent regions, the plurality of second non-transparent regions being respectively located between respective pairs of a second non-phase shift region and a second phase shift region.

9. A method of forming a pattern on a photoresist layer covering a wafer, comprising:

performing a first exposure on the photoresist layer using a first alternating phase shift mask, the first alternating phase shift mask including a first non-transparent region through which light cannot be transmitted, a first non-phase shift region through which light is transmittable and light phase is not changed, another first non-transparent region through which light cannot be transmitted, and a first phase shift region through which light is transmittable and light phase is changed, repeatedly arranged in order in a direction on a first mask substrate; and performing a second exposure on the photoresist layer using a second alternating phase shift mask, the second alternating phase shift mask including a second non-transparent region through which light cannot be transmitted, a second phase shift region through which light is transmittable and light phase is changed, another second non-transparent region through which light cannot be transmitted, and a second non-phase shift region through which light is transmittable and light phase is not changed, repeatedly arranged in order on a second mask substrate in the direction, wherein during the second exposure, the second phase shift regions and the second non-phase shift regions of the second alternating phase shift mask respectively correspond to the first non-phase shift regions and the first phase shift regions of the first mask.

10. The method of claim 9, wherein the first phase shift regions and the second phase shift regions are grooves formed by respectively etching the first mask substrate and the second mask substrate.

11. The method of claim 10, wherein anti-scattering regions are respectively formed between the first non-transparent regions and the first phase shift regions of the first alternating phase shift mask, and anti-scattering regions are respectively formed between the second non-transparent regions and the second phase shift regions of the second alternating phase shift mask.

12. The method of claim 11, wherein the anti-scattering regions are formed by laterally etching sides of the grooves to a prescribed depth.

13. The method of claim 9, wherein anti-scattering regions are respectively formed between the first non-transparent regions and the first phase shift regions of the first alternating phase shift mask, and anti-scattering regions are respectively formed between the second non-transparent regions and the second phase shift regions of the second alternating phase shift mask.

14. The method of claim 9, wherein said performing a second exposure is subsequent said performing a first exposure.

15. A method of forming a pattern on a photoresist layer comprising:

exposing the photoresist layer using a first alternating phase shift mask having at least one first non-phase shift region through which light is transmittable and light phase is not changed, and at least one first phase shift region through which light is transmittable and light phase is changed; and exposing the photoresist layer using a second alternating phase shift mask having at least one second non-phase shift region through which light is transmittable and light phase is not changed, and at least one second phase shift region through which light is transmittable and light phase is changed, the at least one second non-phase shift region and the at least one second phase shift region of the second alternating phase shift mask being respectively aligned to expose respective same regions of the photoresist layer as the at least one first phase shift region and the at least one second non-phase shift region of the first alternating phase shift mask.

16. The method of claim 15, wherein each of the at least one first non-phase shift region and the at least one first phase shift region are respectively formed between non-transparent regions through which light cannot be transmitted.

17. The method of claim 16, wherein anti-scattering regions are formed between the at least one first phase shift region and the non-transparent regions.

18. The method of claim 15, wherein each of the at least one second non-phase shift region and the at least one second phase shift region are respectively formed between non-transparent regions through which light cannot be transmitted.

19. The method of claim 17, wherein anti-scattering regions are formed between the at least one second phase shift region and the non-transparent regions.

* * * * *